(12) United States Patent
Stewart

(10) Patent No.: US 6,707,861 B1
(45) Date of Patent: Mar. 16, 2004

(54) DEMODULATOR FOR AN HDTV RECEIVER

(75) Inventor: John Sidney Stewart, Noblesville, IN (US)

(73) Assignee: Thomson Licensing S.A., Boulogne, Cedex (FR)

( * ) Notice: Subject to any disclaimer, the term of this patent is extended or adjusted under 35 U.S.C. 154(b) by 0 days.

(21) Appl. No.: 09/427,316

(22) Filed: Oct. 26, 1999

(51) Int. Cl.[7] .............................. H03D 1/24; H04N 5/44
(52) U.S. Cl. ...................................... 375/321; 348/725
(58) Field of Search .................................. 375/321, 326, 375/327, 232, 235, 371, 335, 329; 348/521, 725, 735, 495, 500, 726

(56) References Cited

U.S. PATENT DOCUMENTS

| | | | |
|---|---|---|---|
| 5,418,815 A | * 5/1995 | Ishikawa et al. ............. | 375/216 |
| 5,548,344 A | 8/1996 | Park ........................... | 348/726 |
| 5,606,579 A | 2/1997 | Patel et al. .................. | 375/321 |
| 5,706,057 A | * 1/1998 | Strolle et al. ............ | 375/240.01 |
| 5,933,200 A | 8/1999 | Han ............................. | 348/725 |
| 5,959,682 A | * 9/1999 | Kim et al. ................... | 348/511 |
| 6,198,780 B1 | * 3/2001 | Kang .......................... | 375/321 |
| 6,298,100 B1 | * 10/2001 | Bouillet ....................... | 375/326 |
| 6,356,598 B1 | * 3/2002 | Wang .......................... | 375/321 |

FOREIGN PATENT DOCUMENTS

| | | | | |
|---|---|---|---|---|
| EP | 769364 A2 | 4/1997 | ............ | B29D/9/00 |
| WO | 95/26101 | 9/1995 | .......... | H04N/5/455 |
| WO | 97/01234 | 1/1997 | ............ | H04L/27/02 |
| WO | 99/23816 | 5/1999 | ............. | H04N/5/21 |
| WO | 99/23821 | 5/1999 | ............ | H04N/5/44 |

OTHER PUBLICATIONS

*Grand Alliance HDTV System Specification (Draft Document)*, Submitted to the ACATS Technical Subgroup, Feb. 22, 1994 and the 1994 Proceedings of the 48th Annual Broadcast Engineering Conference, Las Vegas, Nevada, Mar. 20, 1994, pp. 9–10 and figure 11.

* cited by examiner

*Primary Examiner*—Khai Tran
(74) *Attorney, Agent, or Firm*—Joseph S. Tripoli; Joseph J. Laks; Ronald H. Kurdyla

(57) ABSTRACT

A receiver for processing a VSB modulated signal containing terrestrial broadcast high definition television information and a pilot component includes a carrier recovery network (22; FIG. 3) that produces a demodulated baseband signal. The carrier recovery network additionally responds to a locally generated control signal (Ph. Offset; 360) representing an unwanted phase offset of the pilot signal due to multipath distortion, for example. The control signal is used to compensate for the pilot phase offset before the demodulated signal is equalized. The control signal is produced by correlating received sync values with both a reference sync value (362) and a Hilbert transform of the reference sync value (363). The output of the carrier recovery network signal is phase compensated twice.

5 Claims, 5 Drawing Sheets

DEMODULATOR FOR AN HDTV RECEIVER

FIELD OF THE INVENTION

This invention concerns a carrier recovery network for demodulating a high definition television signal, e.g., of the VSB-modulated type adopted for use in the United States.

BACKGROUND OF THE INVENTION

The recovery of data from modulated signals conveying digital information in symbol form usually requires three functions at a receiver: timing recovery for symbol synchronization, carrier recovery (frequency demodulation to baseband), and channel equalization. Timing recovery is a process by which a receiver clock (timebase) is synchronized to a transmitter clock. This permits a received signal to be sampled at optimum points in time to reduce slicing errors associated with decision-directed processing of received symbol values. Carrier recovery is a process by which a received RF signal, after being frequency down converted to a lower intermediate frequency passband (e.g., near baseband), is frequency shifted to baseband to permit recovery of the modulating baseband information. Adaptive channel equalization is a process by which the effects of changing conditions and disturbances in the signal transmission channel are compensated for. This process typically employs filters that remove amplitude and phase distortions resulting from frequency dependent time variant characteristics of the transmission channel.

SUMMARY OF THE INVENTION

In accordance with the principles of the present invention, a carrier recovery network produces a demodulated signal in response to a pilot carrier component of the received signal and a locally generated phase correction control signal representing an unwanted phase offset of the pilot signal transmitted with the main data signal.

In a preferred embodiment, a phase offset in a demodulated signal caused by a phase offset of a pilot signal employed in the carrier recovery process is removed before equalizing the demodulated signal. The carrier recovery network uses two rotators (multipliers), both responsive to received I, Q signals to be demodulated. One rotator is associated with a phase control loop that responds to the pilot component. The other rotator also responds to a combined signal produced by combining a signal derived from the phase control loop with an offset signal representing an estimate of undesired phase distortion, such as multipath ("ghost") distortion in the pilot signal.

DETAILED DESCRIPTION OF THE DRAWING

Figure 1:
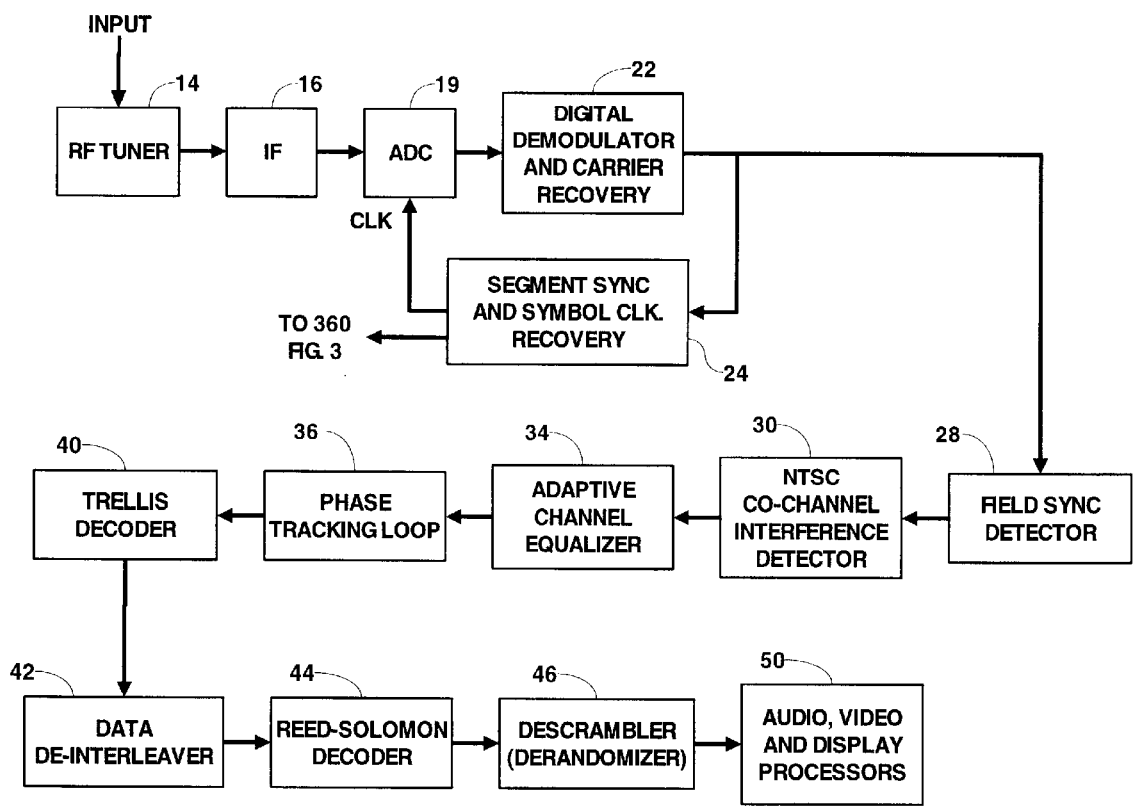
FIG. 1 is a block diagram of a portion of a high definition television (HDTV) receiver including apparatus according to the principles of the present invention.

In FIG. 1, a terrestrial broadcast analog Input HDTV signal is processed by an input network 14 including RF tuning circuits and an intermediate frequency (IF) processor 16 including a tuner for producing an IF passband output signal, and appropriate automatic gain control (AGC) circuits. The received signal is a carrier suppressed 8-VSB modulated signal as proposed by the Grand Alliance and adopted as the ATSC terrestrial broadcast high definition television standard for use in the United States. Such a VSB signal is represented by a one-dimensional data symbol constellation wherein only one axis contains quantized data to be recovered by the receiver. To simplify the Figure, not shown are signals for clocking the illustrated functional blocks.

Figure 2:
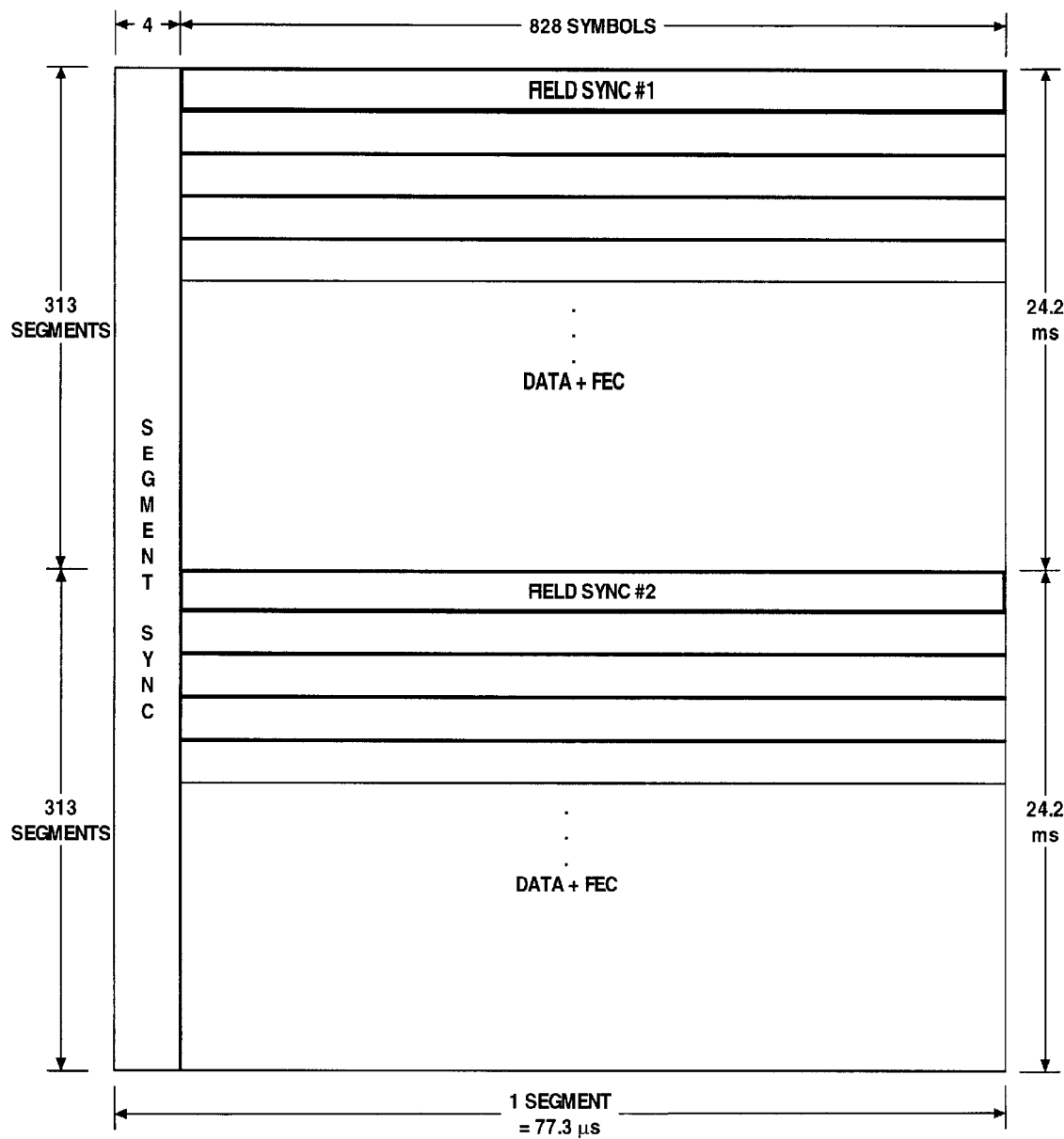
FIG. 2 depicts a data frame format for a VSB modulated signal employing the ATSC high definition system in the United States.

As described in the Grand Alliance HDTV System Specification dated Apr. 14, 1994, the VSB transmission system conveys data with a prescribed data frame format as shown in FIG. 2. A small pilot carrier component (pilot tone) at the suppressed carrier frequency is added to the transmitted signal to help a demodulator achieve carrier lock in a VSB receiver. Referring to FIG. 2, each data frame comprises two fields with each field including 313 segments of 832 multilevel symbols. The first segment of each field is referred to as a field sync segment, and the remaining 312 segments are referred to as data segments. The data segments typically contain MPEG compatible data packets. Each data segment comprises a four symbol segment sync component followed by 828 data symbols. Each field segment includes a four symbol segment sync character followed by a field sync component comprising a predetermined 511 symbol pseudorandom number (PN) sequence and three predetermined 63 symbol PN sequences, the middle one of which is inverted in successive fields. A VSB mode control signal (defining the VSB symbol constellation size) follows the last 63 PN sequence, which is followed by 96 reserved symbols and 12 symbols copied from the previous field. In the ATSC system, a small digital level (1.25) is added to every symbol (data and syncs) of the digital baseband data plus sync signal. This has the effect of adding a small in-phase pilot carrier component to the data signal. Digital addition of the pilot at baseband provides a highly stable and accurate pilot. The frequency of the pilot is the same as the suppressed carrier frequency.

Continuing with FIG. 1, the passband IF output signal from unit 16 is converted to a digital symbol datastream by an analog to digital converter 19. The output digital datastream from ADC 19 is demodulated to baseband by a digital demodulator/carrier recovery network 22. This is achieved by a phase locked loop in response to the pilot component in the received VSB datastream. Unit 22 produces an output I-phase demodulated symbol datastream as described in greater detail with regard to FIG. 3.

ADC 19 samples the input VSB symbol datastream in response to a sampling clock CLK. Associated with ADC 19 and demodulator 22 is a segment sync and symbol clock recovery network 24. Network 24 recovers the repetitive data segment sync components of each data frame from the random data. The segment sync components are used to regenerate a properly phased sampling clock.

Unit 28 detects the data field sync component by comparing every received data segment with an ideal field reference signal stored in memory in the receiver. In addition to field synchronization, the field sync signal provides a training signal for channel equalizer 34. Co-channel NTSC interference detection and rejection are performed by unit 30. Afterwards, the signal is adaptively equalized by channel equalizer 34 which may operate in a combination of blind, training, and decision-directed modes. Equalizer 34 may be of the type described in the Grand Alliance HDTV System Specification and in an article by W. Bretl et al., "VSB Modem Subsystem Design for Grand Alliance Digital Television Receivers," IEEE Transactions on Consumer Electronics, August 1995. Equalizer 34 also may be of the type described in copending U.S. patent application Ser. No. 102,885 of Shiue et al. filed Jun. 23, 1998.

Equalizer 34 compensates for channel distortions, but phase noise randomly rotates the symbol constellation. Phase tracking network 36 removes any residual phase and gain noise present in the output signal from equalizer 34. The phase corrected signal is then trellis decoded by unit 40, de-interleaved by unit 42, Reed-Solomon error corrected by unit 44, and descrambled (de-randomized) by unit 46. Afterwards, a decoded datastream is subjected to audio, video and display processing by unit 50.

Demodulation in unit 22 is performed by a digital automatic phase control (APC) loop to achieve carrier recovery. The phase locked loop uses the pilot component as a reference for initial acquisition, and uses a conventional phase detector for phase acquisition. The pilot signal is embedded in the received datastream, which contains data exhibiting a random, noise-like pattern. The random data is essentially disregarded by the filtering action of the demodulator APC loop. The input signal to ADC 19 is a near baseband signal with the center of the VSB frequency spectrum situated at 5.38 MHz and the pilot component situated at 2.69 MHz. In the demodulated datastream from unit 22 the pilot component has been frequency shifted down to DC.

Figure 3:
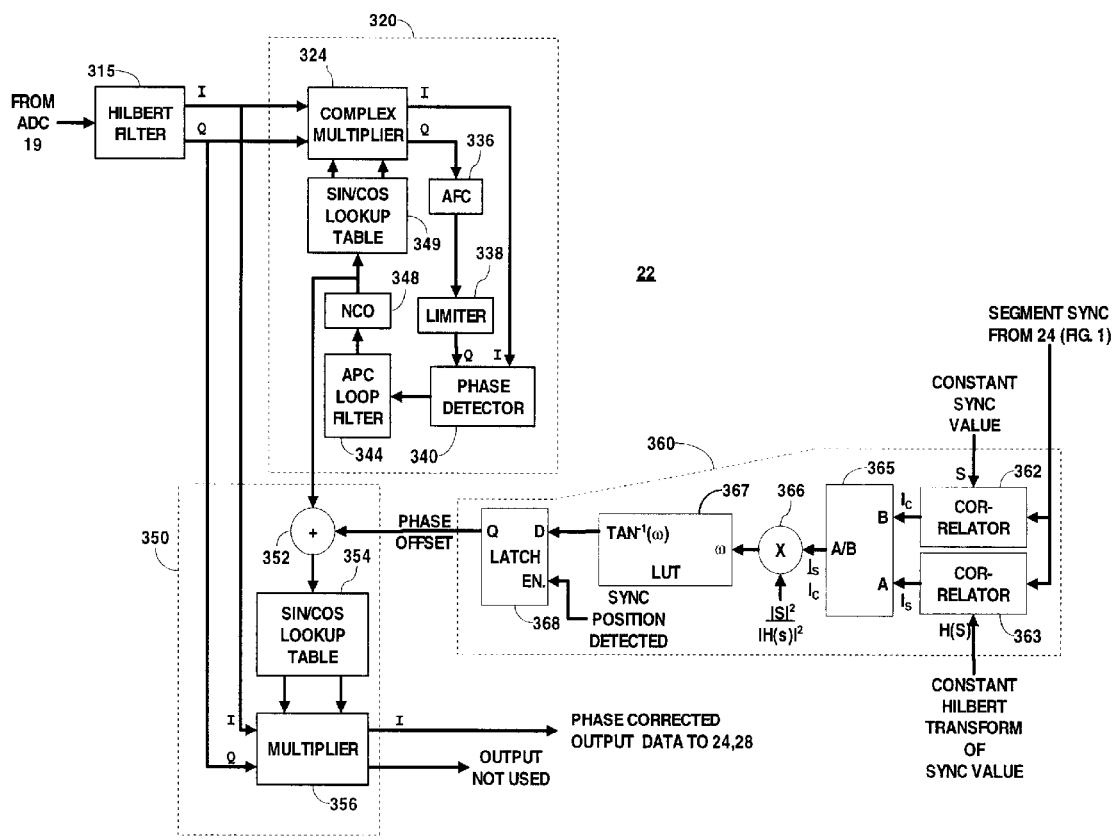
FIG. 3 shows details of a carrier recovery demodulator network in FIG. 1 in accordance with the present invention.

FIG. 3 show details of digital demodulator 22. Demodulator 22 includes a first phase control network 320, a second phase control network 350, and a phase correction signal generator 360. The operation of network 320 will be described first.

The 8-VSB modulated digital symbol datastream from ADC 19, containing the very low frequency pilot component, is applied to Hilbert filter 315 that separates the incoming IF sampled datastream into mutually quadrature phased components "I" (in phase) and "Q" (quadrature phase). The I and Q components are rotated to baseband using complex multiplier 324 in an automatic phase control (APC) loop. Once the loop is synchronized, the output of multiplier 324 is a complex baseband signal that is further phase adjusted by network 350, as will be discussed, to produce a final phase corrected demodulated output from unit 350. The output I datastream from multiplier 324 is used to extract the pilot component of the received datastream. The output Q datastream from multiplier 324 is used to extract the phase of the received signal.

In the phase control loop, The Q signal is filtered by an automatic frequency control (AFC) filter 336. High frequency data (as well as noise and interference) are largely rejected by the AFC filter, leaving only the pilot frequency. After filtering, the Q signal is amplitude limited by unit 338 to reduce the dynamic range requirements of phase detector 340. Phase detector 340 detects and corrects the phase difference between the I and Q signals applied to its inputs, and develops an output phase error signal which is filtered by an APC filter 344, e.g., a second order low pass filter. The phase error detected by unit 340 represents a frequency difference between the expected pilot signal frequency near DC, and the received pilot component frequency.

If the received pilot component exhibits an expected frequency near DC, AFC unit 336 will produce no phase shift. The I and 0 channel pilot components input to phase detector 340 will exhibit no deviation from a mutually quadrature phase relationship, whereby phase detector 340 produces a zero or near zero value phase error output signal. However, if the received pilot component exhibits an incorrect frequency, AFC unit 336 will produce a phase shift. This will result in an additional phase difference between the I and Q channel pilot components applied to the inputs of phase detector 340. Detector 340 produces an output error value in response to this phase difference.

The filtered phase error signal from filter 344 is provided to numerically controlled oscillator (NCO) 348, which locally regenerates the pilot component for demodulating the received datastream. Associated with NCO 348 are sine and cosine look-up tables 349 for regenerating the pilot tone in response to the phase control signal from units 340 and 344. The outputs of unit 349 are controlled until the I and Q signal outputs of multiplier 324 cause the phase error signal produced by detector 340 to be substantially zero, thereby indicating that a demodulated baseband I signal is present at the output of multiplier 324.

Figure 4:
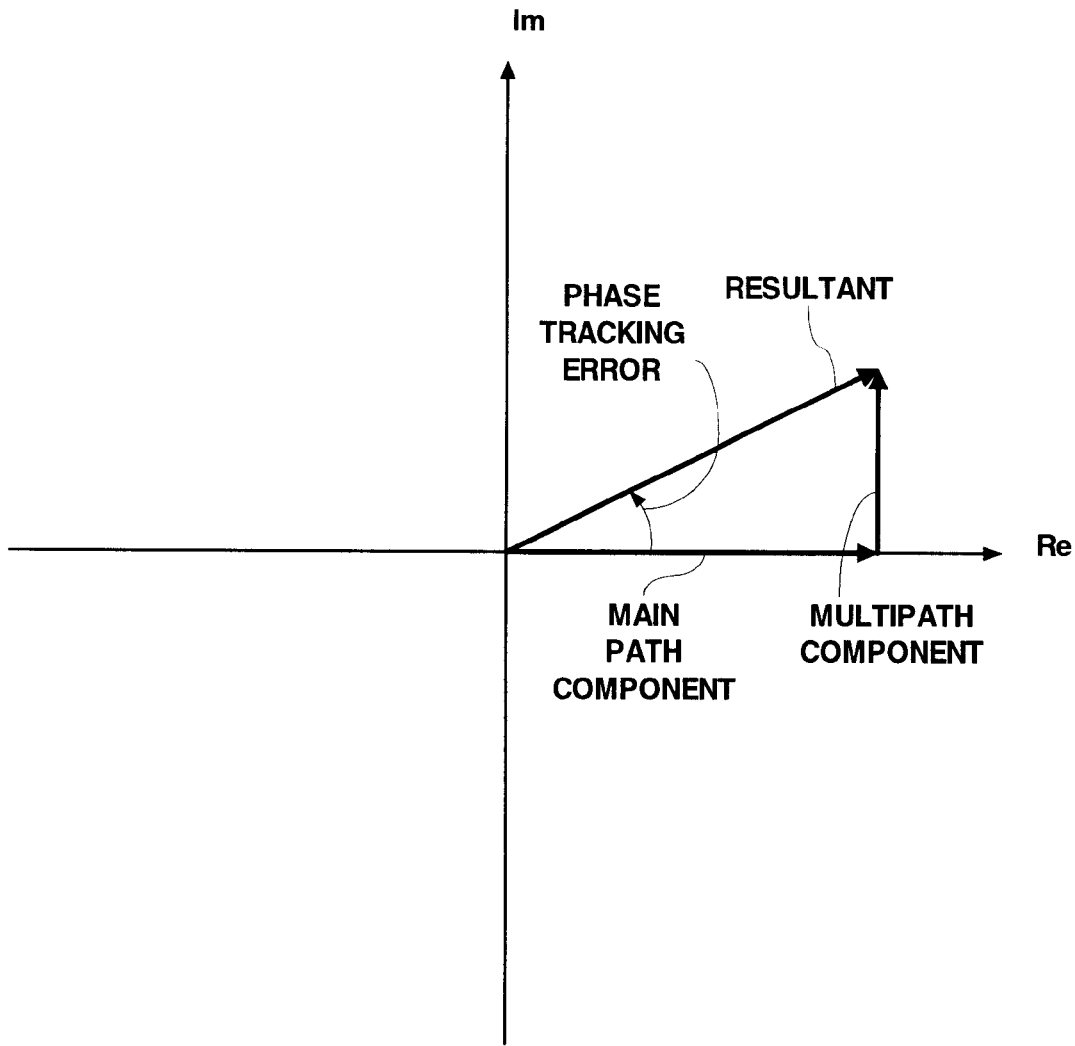
FIG. 4 is a diagram helpful in understanding the operation of the demodulator in FIG. 1.

As noted above, the pilot component in a received VSB modulated signal is tracked by a frequency and phase locked loop (FPLL), and the recovered pilot is used to heterodyne the received spectrum down to baseband. When multipath, or "ghost," components are present in the received spectrum, the carrier tracked by the phase locked loop is the resultant tone produced by the addition of the main path carrier component and the multipath component. This is illustrated in the diagram of FIG. 4. As shown in FIG. 4, multipath distortion produces a phase offset, or Phase Tracking Error, in the pilot, so that the pilot does not exhibit the correct demodulation phase with respect to the data. Thus the reference pilot used for heterodyning has a phase offset with respect to the carrier in the main path, whereby the baseband main path signal receives a phase rotation through the heterodyning process. A subsequent channel equalizer, such as unit 34 in FIG. 1, may be able to compensate for the effects of the pilot phase offset. However, this offset may cause the equalizer to use an excessively large amount of its dynamic range to correct the pilot phase offset, or it may cause the equalizer to become unstable. The additional burden created by the pilot phase offset is removed by a method and apparatus according to a feature of the invention.

Networks 350 and 360 in FIG. 3 address the problem of the pilot phase error. Specifically, second phase control network 350 includes an additional phase rotation network (multiplier) which can rotate the recovered signal independent of the pilot phase. This allows the pilot phase offset to be removed from the recovered data before the data is processed by equalizer 34. The equalizer therefore does not have to compensate for the pilot phase offset, which permits the use of a less complex equalizer design than would otherwise be needed. Phase correction signal generator 360 produces a Phase Offset control signal that is used by phase control network 350 to compensate for the pilot phase offset.

In the illustrated preferred embodiment, the carrier recovery network uses two rotators (multipliers) 324 and 356, both responsive to received I, Q signals. Rotator 324 is associated with a phase control loop in network 320 that responds to the pilot component. The other rotator, unit 356, is associated with control network 350 that additionally responds to a combined signal produced by combining a signal derived from the phase control loop of network 320 with a Phase Offset control signal representing an estimate of undesired phase distortion, such as multipath ("ghost") distortion in the pilot signal. Network 360 produces the Phase Offset control signal by correlating received segment sync values with both reference segment sync values and with a Hilbert transform of the reference segment sync value.

More specifically, multiplier 356 in network 350 receives the mutually quadrature phased I and Q signals from filter 315. Network 350 also receives an input from the output of oscillator 348 in the phase locked loop of network 320. This signal is combined in adder 352 with the Phase Offset control signal produced by network 360 to compensate for the phase offset in the pilot carrier. The output signal of adder 352 is a phase compensated signal that is applied to look-up table 354 for providing mutually quadrature phased output signals to complex multiplier 356 (a second rotator). Look-up table 354 and multiplier 356 operate in the same manner as look-up table 349 and complex multiplier (rotator) 324 in network 320. Multiplier 356 provides I and Q phased output signals. The "I" phased output signal, compensated for the phase offset in the received pilot carrier, is applied to units 24 and 28, and eventually to equalizer 34, as shown in FIG. 1. Since any multipath induced phase offset in the pilot carrier has been significantly reduced or eliminated by the coaction of networks 320, 350 and 360, the equalizer advantageously need not compensate for such offset. The second output of complex multiplier 356, at which a "Q" phased signal would appear, is not used in this example.

The ATSC digital television modulation scheme employs a data field/frame format as explained in connection with FIG. 2. Each data frame is composed of two data fields separated by a field sync component. Each constituent data field comprises a plurality of data segments each prefaced by a segment sync component. These sync components occupy known, fixed locations in the datastream, and will be referred to as sync or sync components in the following discussion. After the received VSB modulated datastream has been demodulated to baseband and the sync components recovered (their locations identified), network 360 performs a correlation between the recovered segment sync components and both known segment sync amplitude values and the Hilbert transform of the known segment sync amplitude values. The Hilbert transform produces a quadrature phased version of an applied input signal, as known. Correlated values are processed to obtain the Phase Offset control signal as follows. The field sync component and its transform can also be used by the correlation function.

Network 360 comprises first and second input correlators 362 and 363, both of which receive as inputs the received baseband segment sync samples. Correlator 362 additionally receives constant segment sync value "S" from local memory, and correlator 363 additionally receives a Hilbert transformed constant segment sync value "H(S)" from local memory. The correlation produced by unit 362 produces an output value Ic defined by the following expression $Ic=Gc|S|^2 \cos \Phi$ where $|S|^2$ is the result of correlating the known sync component with itself, and Gc is an arbitrary gain factor. The correlation produced by unit 363 produces an output value Is defined by the expression $Is=Gs|H(S)|^2 \sin \Phi$ where $|H(S)|^2$ is the result of correlating the Hilbert transform of the known sync component with itself, and Gs=Gc. The pilot phase tracking error is designated by the symbol $\Phi$.

The Is and Ic outputs of correlators 362 and 363 are processed by a network 365 which-produces the mathematical value Is/Ic, or $Is/Ic=|H(S)|^2/|S|^2 \times (\sin \Phi)/(\cos \Phi)$.

The values of the expressions $|H(S)|^2$ and $|S|^2$ are known since they are functions of known sync component values. The term $|H(S)|^2/|S|^2$ in the above expression is cancelled by the multiplication of this term with its inverse (a stored constant) in multiplier 366, producing the following expression at the output of multiplier 366

$Is/Ic=\sin \Phi/\cos \Phi=\tan \Phi$, so that $\Phi=\tan^{-1}(Is/Ic)$.

The term Is/Ic is a numerical value which is used in $\tan^{-1}$ look-up table 367 to determine the value of offset phase shift $\Phi$. The output value from look-up table 367 is applied to a "D" input of latch 368, e.g., a D-type flip-flop. An enable input EN of latch 368 receives a locally generated Sync Position Detected signal when segment sync has been recovered by timing recovery unit 24 (FIG. 1). The Sync Position Detected signal is provided in this example by unit 24, although a local microprocessor that monitors the operations of segment sync timing recovery network 24 could also provide this signal. The Sync Position Detected signal enables latch 367 to output the phase offset signal received at its D input to network 350 as the Phase Offset control signal for use as discussed above.

The demodulated I channel datastream from network 350 is applied to segment sync and symbol clock recovery unit 24 and to field sync detector 28 as shown in FIG. 1. When the repetitive data segment sync pulses are recovered from the random data pattern of the received datastream, the segment syncs are used to achieve proper symbol timing by regenerating a properly phased symbol sampling clock.

Following is a more detailed description of the operation of pilot phase offset estimator network 360. The input signal applied to correlators 362 and 363 is of the form $I(n)=x(n) \cos \Phi - x'(n) \sin \Phi$, where x' is the Hilbert transform of x(n), and the pilot carrier phase offset error to be corrected is $\Phi$. The multi-symbol segment sync pattern for the ATSC system is designated as S, and its Hilbert transform is designated as H' (or H(s)) as discussed above). Correlating S and S' yields $Ic=|S|^2 \cos \Phi$ and $Is=-|S'|^2 \sin \Phi$. Since S and S' are constants, it can be seen that Is/Ic is proportional to $-C \tan \Phi$ where C is a constant. For values of $\Phi$ e.g., between -90 and +90 degrees, $\tan \Phi$ approaches $\Phi$ so that $\Phi$ is approximately equal to $-(Is/Ic) \times (1/C)$. For small values of $\Phi$ Ic is greater than zero, so neglecting the factor $Ic \times C$ results in $\Phi$ approximately equal to some positive scaling of -Is.

Since the four symbol segment sync pattern normally has symbol values +160−160−160+160, normalizing S' to +1 and −1 values produces S'=+1−1−1+1 corresponding to the normal segment sync pattern. This normalization simplifies the Is, Ic correlation process to a process of addition whereby the phase offset error $\Phi e$ is approximately equal to $\Phi e=-S0-S1+S2+S3$ where S0, S1, S2 and S3 represent the four symbols constituting a segment sync pattern. In order to reduce the impact of noise and multipath on the calculation of $\Phi e$, the individual sync symbols S0, S1, S2, S3 are each averaged over a predetermined interval T encompassing 64 consecutive segment sync patterns, for example. Afterwards, a correlation value e' is produced according to the expression $$e' = \frac{-S0' - S1' + S2' + S3'}{T}$$

This value is summed over time (e.g., 64 segment sync intervals) and scaled by a predetermined scale factor G to produce a final estimate value "e." Scale factor G is determined empirically and sets the tracking bandwidth.

Figure 5:
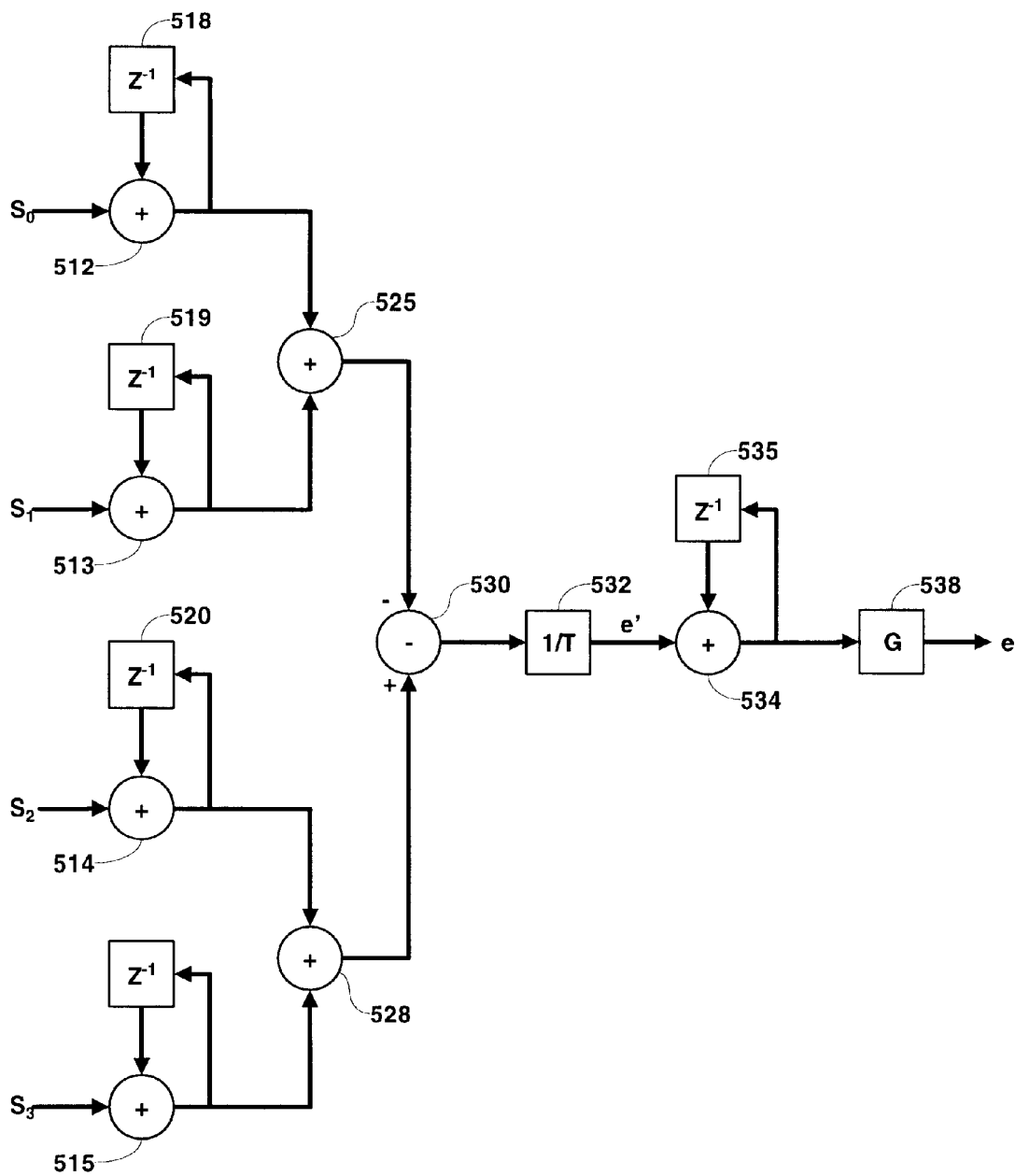
FIG. 5 shows additional details of a portion of the demodulator network in FIG. 1.

The process described above is illustrated by the arrangement shown in FIG. 5. In FIG. 5 an input adder network is constituted by units 512, 513, 514, 515, 525 and 528 arranged as shown. Associated with the adder network are delay elements 518, 519, 520 and 521. Each delay element represents a one symbol delay. The output of adder 525 is subtractively combined with the output of adder 528 in unit 530. The output of combiner 530 is processed by unit 532 to produce the value e' in accordance with the above expression. Unit 532 divides by the number of segment sync components (64) that were summed during previous processing, thereby producing an expected sync amplitude. Afterwards value e' is processed by adder 534 and associated symbol delay 535, and scaled by unit 538 to produce the final error estimate e. The input adder network is reset at the end of each interval T.

What is claimed is:

1. In a receiver for processing a received Vestigial Sideband (VSB) modulated signal containing a pilot carrier component and video data represented by a VSB symbol constellation, said data having a data frame format constituted by a succession of data frames, a method comprising the steps of:

demodulating said received signal in response to said pilot component to produce a demodulated signal, said demodulating signal including a phase offset error attributable to a phase offset error of said pilot component;

equalizing said demodulated signal; and reducing said phase offset error attributable to said pilot component in said demodulated signal, prior to said equalizing step.

2. In a receiver for processing a received Vestigial Sideband (VSB) modulated signal containing a pilot carrier component and video data represented by a VSB symbol constellation, said data having a data frame format constituted by a succession of data frames, a method comprising the steps of:

generating a control signal representing a phase offset error of said pilot component; and demodulating said received signal in response to said pilot component and to said control signal to produce an output demodulated signal.

3. A method according to claim 2, comprising the further step of equalizing said output demodulated signal.

4. In a receiver for processing a received Vestigial Sideband (VSB) modulated signal containing a pilot carrier component and video data represented by a VSB symbol constellation, said data having a data frame format constituted by a succession of data frames, apparatus comprising:

a first phase control network having an input for receiving said modulated signal, and an output for providing a first signal subject to exhibiting a phase offset error attributable to a phase offset of said pilot component;

a control network for generating a control signal representing said phase offset error of said pilot component; and a second phase control network responsive to said received modulated signal, to said first signal, and to said control signal, for providing a phase corrected demodulated signal at an output.

5. Apparatus according to claim 4, wherein said first phase control network includes a phase detector and a first multiplier in a phase locked loop; and said second phase control network includes (a) a combiner network for combining a signal from said phase locked loop and said control signal, and (b) a second multiplier responsive to a combined signal from said combiner network and to said modulated signal.

* * * * *